(12) United States Patent
Hanamoto et al.

(10) Patent No.: US 9,356,203 B2
(45) Date of Patent: *May 31, 2016

(54) PHOSPHOR PARTICLE GROUP AND LIGHT EMITTING APPARATUS USING THE SAME

(71) Applicant: SHARP KABUSHIKI KAISHA, Osaka (JP)

(72) Inventors: Tetsuya Hanamoto, Osaka (JP); Masatsugu Masuda, Osaka (JP); Kenji Terashima, Osaka (JP)

(73) Assignee: GE Phosphors Technology, LLC, Niskayuna, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/176,442

(22) Filed: Feb. 10, 2014

(65) Prior Publication Data

US 2014/0184056 A1    Jul. 3, 2014

Related U.S. Application Data

(63) Continuation of application No. 13/303,907, filed on Nov. 23, 2011, now Pat. No. 8,686,631, which is a continuation of application No. 12/668,074, filed as application No. PCT/JP2008/061102 on Jun. 18, 2008, now Pat. No. 8,084,942.

(30) Foreign Application Priority Data

Jul. 9, 2007  (JP) ................................. 2007-179464

(51) Int. Cl.
*H01J 63/04*    (2006.01)
*H01L 33/50*    (2010.01)
(Continued)

(52) U.S. Cl.
CPC .......... *H01L 33/502* (2013.01); *C01B 21/0826* (2013.01); *C04B 35/597* (2013.01);
(Continued)

(58) Field of Classification Search
CPC .............. H01L 51/5052; H01L 33/502; Y10T 428/2982; C01B 21/0826; C01P 2004/54; C01P 2004/61; C01P 2006/60; C04B 35/597; C04B 2235/3224; C04B 2235/5296; C04B 2235/5436; C04B 2235/767; C04B 2235/9646; C09K 11/0883; C09K 11/7734
USPC ....................................................... 313/504
See application file for complete search history.

(56) References Cited

U.S. PATENT DOCUMENTS 6,472,765 B1    10/2002   Sano et al.
7,833,436 B2    11/2010   Shimooka et al.
(Continued)

FOREIGN PATENT DOCUMENTS

CN    1839191 A       9/2006
EP    1 854 864       11/2007
(Continued)

OTHER PUBLICATIONS

Office Action dated Feb. 3, 2014, issued in connection with U.S. Appl. No. 13/729,191.
(Continued)

*Primary Examiner* — Anh Mai
*Assistant Examiner* — Hana Featherly
(74) *Attorney, Agent, or Firm* — Meagher Emanuel Laks Goldberg & Liao, LLP

(57) ABSTRACT

Provided is a phosphor particle group of divalent europium-activated oxynitride green light emitting phosphor particles each of which is a β-type SiAlON substantially represented by a general formula: $Eu_a Si_b Al_c O_d N_e$, where $0.005 \leq a \leq 0.4$, $b+c=12$, $d+e=16$, wherein 60% or more of the phosphor particle group is composed of the phosphor particles in which a value obtained by dividing a longer particle diameter by a shorter particle diameter is greater than 1.0 and not greater than 3.0. A high-efficiency and stable light emitting apparatus using a β-type SiAlON, which includes a light converter using the phosphor particle group, and a phosphor particle group therefor are also provided.

12 Claims, 1 Drawing Sheet

(51) Int. Cl.
*C01B 21/082* (2006.01)
*C04B 35/597* (2006.01)
*C09K 11/08* (2006.01)
*C09K 11/77* (2006.01)

(52) U.S. Cl.
CPC ......... *C09K11/0883* (2013.01); *C09K 11/7734* (2013.01); *C01P 2004/54* (2013.01); *C01P 2004/61* (2013.01); *C01P 2006/60* (2013.01); *C04B 2235/3224* (2013.01); *C04B 2235/5296* (2013.01); *C04B 2235/5436* (2013.01); *C04B 2235/767* (2013.01); *C04B 2235/9646* (2013.01); *Y10T 428/2982* (2015.01)

(56) References Cited

U.S. PATENT DOCUMENTS

| | | | |
|---|---|---|---|
| 8,084,942 | B2 | 12/2011 | Hanamoto et al. |
| 2001/0001207 | A1 | 5/2001 | Shimizu et al. |
| 2002/0039002 | A1 | 4/2002 | Fukasawa et al. |
| 2004/0000868 | A1 | 1/2004 | Shimizu et al. |
| 2004/0012027 | A1 | 1/2004 | Keller et al. |
| 2006/0022573 | A1 | 2/2006 | Gotoh et al. |
| 2007/0012931 | A1 | 1/2007 | Lee et al. |
| 2007/0108896 | A1* | 5/2007 | Hirosaki ................. 313/506 |
| 2007/0215892 | A1 | 9/2007 | Ishii et al. |
| 2009/0057611 | A1 | 3/2009 | Hirosaki |
| 2010/0176713 | A1 | 7/2010 | Hanamoto et al. |
| 2012/0026426 | A1 | 2/2012 | Hanamoto et al. |
| 2012/0068595 | A1 | 3/2012 | Hanamoto et al. |
| 2012/0305844 | A1 | 12/2012 | Emoto et al. |

FOREIGN PATENT DOCUMENTS

| | | |
|---|---|---|
| EP | 1 867 698 | 12/2007 |
| EP | 1 964 905 A1 | 9/2008 |
| JP | 2005-003436 | 1/2005 |
| JP | 2005-255895 | 9/2005 |
| WO | WO 2005/103199 | 11/2005 |
| WO | 2006/093135 | 9/2006 |
| WO | 2006/101095 | 9/2006 |
| WO | 2006/121083 A1 | 11/2006 |
| WO | 2007/066733 A1 | 6/2007 |

OTHER PUBLICATIONS

International Search Report for PCT/JP2008/061102 mailed, Sep. 30, 2008.
Supplementary European Search Report mailed Jun. 30, 2010 in corresponding EP application 08777306.5.
Office Action mailed Apr. 5, 2013 in U.S. Appl. No. 11/944,052.
Office Action dated Jul. 30, 2013, issued in connection with related U.S. Appl. No. 13/729,191.
Notice of Allowance mailed Oct. 17, 2013, issued in connection with related U.S. Appl. No. 11/944,052, Determination of Patent Term Adjustment dated Oct. 17, 2013 mailed in U.S. Appl. No. 11/944,052, Notice of Allowability mailed in U.S. Appl. No. 11/944,052, Notice of References Cited in U.S. Appl. No. 11/944,052, with Notice of Allowance, Examiner initialed Information Disclosure Statement in U.S. Appl. No. 11/944,052, bearing receipt date "Jun. 5, 2013", Identification of Copending Application(s) in U.S. Appl. No. 11/944,052, bearing receipt date "Aug. 5, 2013" and Examiners initials.
Notice of Allowance mailed Dec. 13, 2013, issued in connection with related U.S. Appl. No. 13/500,803, Determination of Patent Term Adjustment dated Dec. 13, 2013 mailed in U.S. Appl. No. 13/500,803, Notice of Allowability mailed in U.S. Appl. No. 13/500,803.
Notice of Allowance dated Mar. 20, 2014, issued in connection with U.S. Appl. No. 13/729,191.
Office Action dated Apr. 17, 2014, issued in connection with related U.S. Appl. No. 13/263,053.
U.S. Patent Office, Office Action dated Sep. 22, 2014, issued in connection with U.S. Appl. No. 14/470,153 (First Named Inventor: Masatsugu Masuda).
Office Action dated Apr. 9, 2015, issued in connection with U.S. Appl. No. 14/166,231.
Office Action dated Mar. 10, 2015, issued in connection with U.S. Appl. No. 14/615,017.
Office Action dated Oct. 2, 2015, issued in connection with U.S. Appl. No. 14/166,231 (Masuda).
Office Action dated Dec. 16, 2015 and listings of considered art initialed by Examiner, issued in connection with U.S. Appl. No. 14/936,037 (Masuda).

* cited by examiner

PHOSPHOR PARTICLE GROUP AND LIGHT EMITTING APPARATUS USING THE SAME

This application is a continuation of application Ser. No. 13/303,907 (issued as U.S. Pat. No. 8,686,631), which was filed on Nov. 23, 2011 (published as 2012-0068595 A1 on Mar. 22, 2012), which is a continuation of application Ser. No. 12/668,074 (issued as U.S. Pat. No. 8,084,942), which was filed on Jan. 7, 2010 (published as 2010-0176713-A1 on Jul. 15, 2010), which is a U.S. national phase of International Application No. PCT/JP2008/061102, filed 18 Jun. 2008, which designated the U.S. and claims priority to Japanese Application No. 2007-179464, filed 9 Jul. 2007, the entire contents of each of which are hereby incorporated by reference.

TECHNICAL FIELD

The present invention relates to a particle group of phosphor particles (phosphor particle group) suitable for light emitting apparatus and a light emitting apparatus using the same in a light converter.

BACKGROUND ART

Light emitting apparatus using a combination of light emitting elements and phosphors attracts attention as a next generation light emitting apparatus expected to realize low power consumption, compact size, high intensity, high color gamut, and high color rendition, and are actively researched and developed. Primary light emitted from a light emitting element in a range from the longer ultraviolet to the visible blue, i.e. 380-480 nm, is usually used. Light converter using various phosphors suitable for this application are also proposed.

At present, as a white light emitting apparatus of this type, a combination of a light emitting element emitting blue light (peak wavelength: around 460 nm) and a trivalent cerium-activated $(Y, Gd)_3(Al, Ga)_5O_{12}$ phosphor or a divalent europium-activated $2(Sr, Ba, Ca)O \cdot SiO_2$ phosphor, which is excited by the blue light and emits yellow light, is mainly used. In such a light emitting apparatus, however, color gamut (NTSC ratio) is about 70%, although higher color gamut is required in compact LCD.

Furthermore, for the light emitting apparatus of this type, an attempt has recently been made not only to improve luminous efficiency (brightness) but also to increase input energy to achieve higher brightness. When input energy is increased, it becomes necessary to effectively dissipate the heat of the entire light emitting apparatus including the light converter. For achieving this, the development of the entire structure and materials of light emitting apparatus has been pursued. However, a temperature rise in the light emitting element and the light converter during operation is still inevitable.

However, the trivalent cerium-activated $(Y, Gd)_3(Al, Ga)_5O_{12}$ phosphor, in particular, there is a technical problem in that it is impossible to set input energy at high status, because the luminance at 100° C. decreases to about 85%, compared to the luminance (brightness) of 100% at 25° C. Therefore, it is urgently necessary to improve the temperature characteristic of phosphors to be used for the light emitting apparatus of this type.

For these technical problems, it is known that the use of a divalent europium-activated oxynitride green light emitting phosphor which is a β-type SiAlON substantially represented by $Eu_aSi_bAl_cO_dN_e$ results in a light emitting apparatus having good color gamut (NTSC ratio) and temperature characteristic.

However, the divalent europium-activated oxynitride green light emitting phosphor which is a β-type SiAlON is basically a columnar crystal, and as for a group of phosphor particles (phosphor particle group), a phosphor with a value obtained by dividing a longer particle diameter by a shorter particle diameter exceeding five is easily produced. The use of a phosphor particle group including a large number of particles with the value obtained by dividing a longer particle diameter by a shorter particle diameter exceeding five has a technical problem in that when the phosphor particle group is dispersed in a resin, such a phenomenon as aggregation which is assumed to be attributable to the form factor takes place to prevent uniform dispersion, and a good characteristic (brightness) cannot be obtained.

Therefore, it is urgently necessary to develop a divalent europium-activated oxynitride green light emitting phosphor which is a β-type SiAlON substantially represented by $Eu_aSi_bAl_cO_dN_e$ having a controlled shape, and a high-efficiency light emitting apparatus using the same. Japanese Patent Laying-Open No. 2005-255895 (Patent Document 1), for example, discloses a β-type SiAlON in which a mean value of the aspect ratio (the value obtained by dividing the length of the longer axis of a particle by the length of the shorter axis) is 1.5 or more and 20 or less. However, in the examples of Patent Document 1, the aspect ratio of the phosphor particle in each example is not disclosed, and no mention is made to the aspect ratio and the characteristic. Here, the longer axis corresponds to the longer particle diameter in the present application and the shorter axis corresponds to the shorter particle diameter in the present application. Furthermore, Patent Document 1 only shows a columnar shape (photograph) in FIG. 2.

Patent Document 1: Japanese Patent Laying-Open No. 2005-255895

DISCLOSURE OF THE INVENTION

Problems to be Solved by the Invention

The present invention is made to solve the aforementioned problems. An object of the present invention is to provide a high-efficiency and stable light emitting apparatus using a β-type SiAlON and a phosphor particle group therefor.

Means for Solving the Problems

As a result of elaborate investigation, study and development for solving the aforementioned problems, the present inventors have found that it is possible to obtain a light emitting apparatus with a good characteristic (brightness) by using a particle group of β-type SiAlON having a controlled crystal shape. More specifically, the present invention is as follows.

A phosphor particle group in accordance with the present invention is a particle group of divalent europium-activated oxynitride green light emitting phosphor particles each of which is a β-type SiAlON substantially represented by a general formula: $Eu_aSi_bAl_cO_dN_e$, where $0.005 \leq a \leq 0.4$, $b+c=12$, $d+e=16$, wherein 60% or more of the phosphor particle group is composed of the phosphor particles in which a value obtained by dividing a longer particle diameter by a shorter particle diameter is greater than 1.0 and not greater than 3.0.

Preferably, 80% or more of the phosphor particle group of the present invention is composed of the phosphor particles in which a value obtained by dividing a longer particle diameter by a shorter particle diameter is greater than 1.0 and not greater than 3.0.

Preferably, in the general formula above of the phosphor particle group of the present invention, $0.01 \leq a \leq 0.2$.

Preferably, the phosphor particle group of the present invention has a median diameter in a range of 6-20 μm.

The present invention also provides a light emitting apparatus including a light emitting element of a gallium nitride-based semiconductor emitting primary light of 430-480 nm; and a light converter absorbing a part of the primary light to emit secondary light having a longer wavelength than that of the primary light. The light converter includes a phosphor particle group of divalent europium-activated oxynitride green light emitting phosphors each of which is a β-type SiAlON substantially represented by a general formula: $Eu_a Si_b Al_c O_d N_e$, where $0.005 \leq a \leq 0.4$, $b+c=12$, $d+e=16$, wherein 60% or more of the phosphor particle group is composed of the phosphor particles in which a value obtained by dividing a longer particle diameter by a shorter particle diameter is greater than 1.0 and not greater than 3.0.

Preferably, in the light emitting apparatus of the present invention, 80% or more of the phosphor particle group is composed of the phosphor particles in which a value obtained by dividing a longer particle diameter by a shorter particle diameter is greater than 1.0 and not greater than 3.0.

Preferably, in the light emitting apparatus of the present invention, in the general formula above of the phosphor particle group, $0.01 \leq a \leq 0.2$.

Preferably, in the light emitting apparatus of the present invention, a median diameter of the phosphor particle group is in a range of 6-20 μm.

Effects of the Invention

In accordance with the present invention, it is possible to provide a light emitting apparatus capable of efficiently absorbing primary light from a light emitting element and yielding white light with high efficiency, excellent color gamut (NTSC ratio) and a good temperature characteristic, and a phosphor particle group suitably used in the same.

DESCRIPTION OF THE REFERENCE SIGNS 1 phosphor particle, 11 light emitting apparatus, 12 light emitting element, 13 light converter, 14 phosphor particle other than a phosphor particle group of the present invention

BEST MODES FOR CARRYING OUT THE INVENTION

A phosphor particle group of the present invention is composed of particles of a divalent europium-activated oxynitride green light emitting phosphor which is a β-type SiAlON substantially represented by the following general formula:

$Eu_a Si_b Al_c O_d N_e$   general formula:

where the value of "a" is the number that satisfies $0.005 \leq a \leq 0.4$, the values of "b" and "c" are the numbers that satisfy $b+c=12$, and the values of "d" and "e" are the numbers that satisfy $d+e=16$ In the formula above, if the value of "a" is less than 0.005, inconveniently, sufficient brightness cannot be obtained, and if the value of "a" exceeds 0.4, inconveniently, brightness significantly reduces due to concentration quenching and the like. If the addition amount of Eu is less than 0.01, phosphor particles not including Eu may be included in the phosphor particle group. On the other hand, if the addition amount of Eu exceeds 0.2, segregation of Eu may occur and phosphor particles including much Eu may be included in the phosphor particle group. In terms of maintaining stability as the powder characteristic and host crystal homogeneity, the value of "a" in the formula above is preferably the number that satisfies $0.01 \leq a \leq 0.2$.

Specifically, examples of the divalent europium-activated oxynitride green light emitting phosphor which is a β-type SiAlON substantially represented by the formula above are $Eu_{0.05}Si_{11.50}Al_{0.50}O_{0.05}N_{15.95}$, $Eu_{0.10}Si_{11.00}Al_{1.00}O_{0.10}N_{15.90}$, $Eu_{0.30}Si_{9.80}Al_{2.20}O_{0.30}N_{15.70}$, $Eu_{0.15}Si_{10.00}Al_{2.00}I_{0.20}N_{15.80}$, $Eu_{0.01}Si_{11.60}Al_{0.40}O_{0.01}N_{15.99}$, $Eu_{0.005}Si_{11.70}Al_{0.30}O_{0.03}N_{15.97}$, $Eu_{0.25}Si_{11.65}Al_{0.35}O_{0.06}N_{5.94}$, $Eu_{0.40}Si_{11.35}Al_{0.65}O_{0.15}N_{15.85}$, and the like. The present invention is, however, not limited thereto, as a matter of course.

Figure 1:
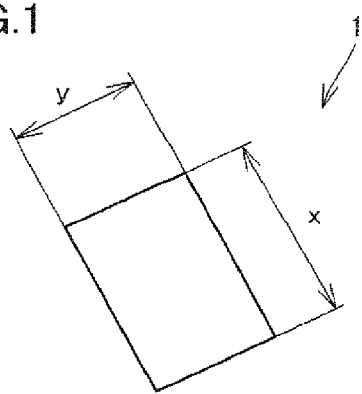
FIG. 1 is a diagram schematically showing a phosphor particle 1 included in a phosphor particle group of the present invention.

Here, FIG. 1 is a diagram schematically showing a phosphor particle 1 included in the phosphor particle group in accordance with the present invention. The phosphor particle group of the present invention is characterized in that 60% or more of the phosphor particle group is composed of phosphor particles each having a columnar shape as shown in FIG. 1 in which the value (aspect ratio) obtained by dividing the longer particle diameter x (a linear distance along the longer axis) by the shorter particle diameter y (a linear distance along the shorter axis) is greater than 1.0 and not greater than 3.0. If the phosphor particles with the value obtained by dividing the longer particle diameter by the shorter particle diameter being greater than 1.0 and not greater than 3.0 constitute less than 60% of the phosphor particle group, the phosphor particles cannot be dispersed finely in a light converter (as described later) of a light emitting apparatus using such a phosphor particle group, and therefore, sufficient brightness cannot be obtained. The phosphor particles with the value obtained by dividing the longer particle diameter by the shorter particle diameter being greater than 1.0 and not greater than 3.0 preferably constitute 80% or more of the phosphor particle group and more preferably constitute 90% or more, since it is possible to build a good light converter in which phosphor particles are dispersed very finely, and to realize a light emitting apparatus having an extremely stable characteristic.

It is noted that the value obtained by dividing the longer diameter by the shorter diameter of the phosphor particle included in the above-mentioned phosphor particle group can be measured, for example, using a scanning electron microscope (SEM), a transmission electron microscope (TEM), or an optical microscope. The proportion of those phosphor particles with the value obtained by dividing the longer particle diameter by the shorter particle diameter being greater than 1.0 and not greater than 3.0, which are included in the phosphor particle group, can also be measured, for example, using a scanning electron microscope (SEM), a transmission electron microscope (TEM), or an optical microscope.

The median diameter (D50) of the phosphor particle group of the present invention is preferably in the range of 6-20 μm and more preferably in the range of 7-12 μm. If the median diameter of the phosphor particle group of the present invention is less than 6 μm, crystal growth is insufficient, and it may be impossible to obtain sufficient brightness in the light emitting apparatus using such a phosphor particle group. On the other hand, if greater than 20 μm, it may be difficult to build a light converter in which phosphor particles are uniformly dispersed. It is noted that the above-noted median diameter (D50) refers to a value measured using a particle size distribution measuring equipment (LA-920 manufactured by HORIBA, Ltd.).

The phosphor particle group of the present invention can be produced by any conventionally-known appropriate method, except that 60% or more is composed of phosphor particles in which the value obtained by dividing the longer particle diameter by the shorter particle diameter is greater than 1.0 and not greater than 3.0. As for the phosphor particles that constitute 60% or more of the phosphor particle group of the present invention, the method of controlling the value obtained by dividing the longer diameter by the shorter diameter of the phosphor particle such that it is greater than 1.0 and not greater than 3.0 includes, for example, accurately controlling an oxygen concentration, accurately controlling the density and volume of raw materials in a firing container (the state of raw materials charged in a firing container), and optimizing a temperature profile at a time of synthesis. The present invention is, however, not limited to those methods described above.

Figure 2:
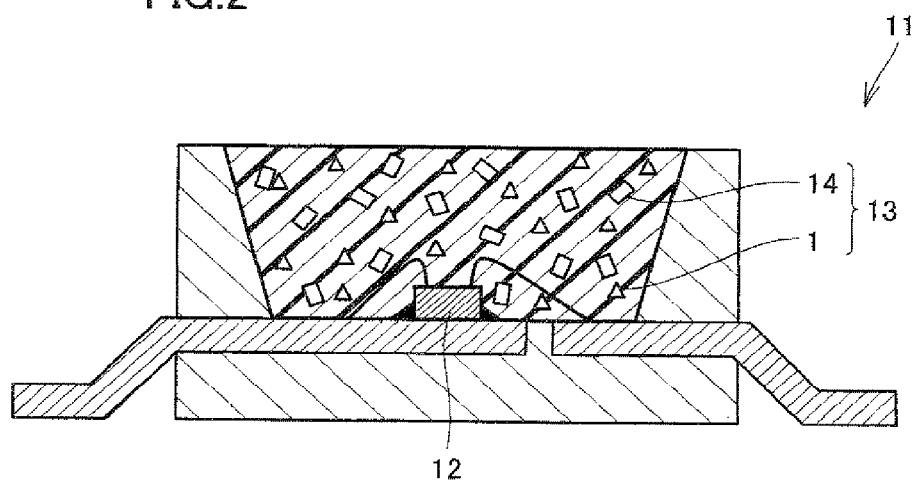
FIG. 2 is a cross-sectional view schematically showing a light emitting apparatus 11 in a preferable example of the present invention.

The present invention also provides a light emitting apparatus using the aforementioned phosphor particle group in accordance with the present invention. More specifically, the light emitting apparatus of the present invention basically includes a light emitting element emitting primary light, and a light converter that absorbs part of the above-noted primary light and emits secondary light having a wavelength equal to or longer than that of the primary light. The light converter includes the above-noted phosphor particle group in accordance with the present invention. Here, FIG. 2 is a cross-sectional view schematically showing a light emitting apparatus 11 as a preferable example of the present invention. Light emitting apparatus 11 of the example shown in FIG. 2 basically includes a light emitting element 12 and a light converter 13. Light converter 13 includes a plurality of phosphor particles 1. The plurality of phosphor particles 1 constitute the phosphor particle group of the present invention as described above.

The light emitting apparatus of the present invention includes a light converter including the phosphor particle group of the present invention, 60% or more of which is composed of phosphor particles in which the above-noted value obtained by dividing the longer particle diameter by the shorter particle diameter is greater than 1.0 and not greater than 3.0. Such a light emitting apparatus in accordance with the present invention can efficiently absorb primary light from the light emitting element and can yield white light having high-efficiency and excellent color gamut (NTSC ratio) and having a good temperature characteristic.

A gallium nitride (GaN)-based semiconductor is used for light emitting element 12 used in light emitting apparatus 11 of the present invention, in terms of efficiency. In light emitting apparatus 11 of the present invention, light emitting element 12 that emits primary light having a peak wavelength in the range of 430-480 nm is used. The use of a light emitting element having a peak wavelength of less than 430 nm reduces contribution of blue component, worsens color rendition, and thus is not practical. On the other hand, the use of a light emitting element having a peak wavelength of greater than 480 nm reduces brightness of white and thus is not practical. In terms of efficiency, light emitting element 12 in light emitting apparatus 11 of the present invention preferably emits primary light in the range of 440-470 nm.

In light emitting apparatus 11 of the present invention in the example shown in FIG. 2, the medium of light converter 13 is not specifically limited as long as light converter 13 contains the phosphor particle group of the present invention and can absorb a part of primary light emitted from light emitting element 12 and emit secondary light having a wavelength equal to or longer than that of the primary light. For example, epoxy resin, silicone resin, urea resin, or the like may be used as a medium (transparent resin), although the present invention is not limited thereto. Light converter 13 may contain any appropriate additive such as $SiO_2$, $TiO_2$, $ZrO_2$, $Al_2O_3$, $Y_2O_3$, as a matter of course, to such an extent that the effect of the present invention is not inhibited.

Light converter 13 of light emitting apparatus 11 of the present invention may include phosphor particles 14 other than the above-mentioned phosphor particle group of the present invention, as shown in the example in FIG. 2, as a matter of course. Other phosphor particle that may be included in light converter 13, other than the phosphor particle group of the present invention, is not specifically limited. However, since the phosphor particle group of the present invention is composed of green light emitting phosphor particles, particles of a divalent europium-activated nitride red light emitting phosphor expressed by the following general formula are suitable, considering that a light emitting apparatus presenting white light by mixing light can be realized.

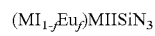

General formula: $(MI_{1-f}Eu_f)MIISiN_3$

In the formula above, MI is an alkaline-earth metal and refers to an element of at least one kind selected from Mg, Ca, Sr, and Ba. Furthermore, in the formula above, MII is a trivalent metallic element and refers to an element of at least one kind selected from Al, Ga, In, Sc, Y, La, Gd, and Lu. Among them, MII is preferably an element of at least one kind selected from Al, Ga, and In, since red light can be emitted even more efficiently. In addition, in the formula above, the value of "f" is $0.0010 \leq f \leq 0.10$ and is preferably $0.005 \leq f \leq 0.05$. If the value of "f" is less than 0.001, it may be impossible to obtain sufficient brightness, and if the value of "f" exceeds 0.10, brightness may greatly reduce due to concentration quenching and the like.

Specifically, examples of such a divalent europium-activated nitride red light emitting phosphor are $Ca_{0.99}Eu_{0.01}SiAlN_3$, $(Ca_{0.97}Mg_{0.02}Eu_{0.01})(Al_{0.99}Ga_{0.01})SiN_3$, $(Ca_{0.98}Eu_{0.02})AlSiN_3$, $(Ca_{0.97}Sr_{0.01}Eu_{0.02})(Al_{0.98}In_{0.02})SiN_3$, $(Ca_{0.999}Eu_{0.001})AlSiN_3$, $(Ca_{0.895}Mg_{0.100}Eu_{0.005})AlSiN_3$, $(Ca_{0.79}Sr_{0.20}Eu_{0.01})AlSiN_3$, $(Ca_{0.98}Eu_{0.02})(Al_{0.95}Ga_{0.05})SiN_3$, and the like, although the present invention is not limited thereto, as a matter of course.

When the above-noted divalent europium-activated nitride red light emitting phosphor is used, the mixture ratio thereof to the phosphor particle group of the present invention in light converter 13 is preferably in the range of 1-35% by weight and more preferably in the range of 5-25% by weight with respect to the phosphor particle group of the present invention, though not being limited.

Light converter 13 in light emitting apparatus 11 of the present invention may include a phosphor particle other than the phosphor particle group of the present invention, excluding the above-noted divalent europium-activated nitride red light emitting phosphor, to such an extent that the effect of the present invention is not inhibited. Furthermore, such a phosphor particle other than the phosphor particle group of the present invention and the above-noted divalent europium-activated nitride red light emitting phosphor may be included additionally in light converter 13, in addition to the phosphor particle group of the present invention and the above-noted divalent europium-activated nitride red light emitting phosphor.

Light emitting apparatus 11 of the present invention can be manufactured by any conventionally-known appropriate technique, and the manufacturing method is not specifically limited. For example, it may be manufactured by mixing the phosphor particle group of the present invention (and a phosphor particle other than the phosphor particle group of the present invention, as necessary) in a sealing material made of thermosetting silicone resin, and then sealing in light emitting element 12.

Although the present invention will be described in more detail taking examples and comparative examples below, the present invention is not limited thereto.

Example 1

Comparative Example 1

A gallium nitride (GaN)-based semiconductor having a peak wavelength of 450 nm was used as a light emitting element. A light converter was produced by using a phosphor particle group, which was a particle group of green light emitting phosphor particles having a composition of $Eu_{0.05}Si_{11.50}Al_{0.50}O_{0.05}N_{15.95}$ (β-type SiAlON) (D50: 7.8 μm), and 85% of which was composed of particles with the value obtained by dividing the longer particle diameter by the shorter particle diameter being greater than 1.0 and not greater than 3.0. The phosphor particle group was prepared by optimizing the oxygen concentration. Here, LA-920 (manufactured by HORIBA Ltd.) was used as a particle size distribution measuring equipment. The light converter was fabricated by dispersing the phosphor particle group in a prescribed proportion in a sealing material made of thermosetting silicone resin as a medium and then sealing in a light emitting element. A light emitting apparatus of Example 1 was thus fabricated. The characteristic (brightness) of the light emitting apparatus of Example 1 fabricated in this manner was evaluated by turning on the light emitting apparatus at forward current (IF) of 20 mA and measuring optical power (photocurrent) from the light emitting apparatus.

On the other hand, a light emitting apparatus of Comparative Example 1 was fabricated in the similar manner as above, except that the phosphor particle group was a particle group of green light emitting phosphor particles having a composition of $Eu_{0.05}Si_{11.50}Al_{0.50}O_{0.05}N_{15.95}$ (β-type SiAlON) (D50: 7.6 μm) and that 40% of the phosphor particle group was composed of particles with the value obtained by the longer particle diameter by the shorter particle diameter being greater than 1.0 and not greater than 3.0. The characteristic was evaluated similarly.

The results of Example 1 and Comparative Example 1 are shown in Table 1. Table 1 shows that the light emitting apparatus of Example 1 is superior in characteristic (brightness) to the light emitting apparatus of Comparative Example 1.

TABLE 1

|  | brightness (relative value) |
|---|---|
| Example 1 | 105.1% |
| Comparative Example 1 | 100.0% |

Examples 2-7

Comparative Examples 2-7

Light emitting apparatus of Examples 2-7, Comparative Examples 2-7 were produced in the manner similar to Example 1 except the proportion (%) of particles with the value obtained by dividing the longer particle diameter by the shorter particle diameter being greater than 1.0 and not greater than 3.0, and D50, and the light emitting elements, as shown in Table 2. The results of the characteristic (brightness) measured in the manner similar to Example 1 are also shown in Table 2. Table 2 shows that the light emitting apparatus of Examples 2-7 are superior in characteristic (brightness) to the light emitting apparatus of Comparative Examples 2-7.

TABLE 2

|  | proportion of phosphor particles having the value obtained by dividing the longer particle diameter by the shorter particle diameter of greater than 1.0 and not greater than 3.0 | median value (D50) | peak wavelength of light emitting element | brightness (relative value) |
|---|---|---|---|---|
| Example 2 | 80% | 8.6 μm | 440 nm | 104.5% |
| Comparative Example 2 | 50% | 8.3 μm | 440 nm | 100.0% |
| Example 3 | 60% | 10.5 μm | 460 nm | 104.1% |
| Comparative Example 3 | 35% | 10.3 μm | 460 nm | 100.0% |
| Example 4 | 90% | 13.5 μm | 455 nm | 106.3% |
| Comparative Example 4 | 10% | 13.4 μm | 455 nm | 100.0% |
| Example 5 | 75% | 9.3 μm | 430 nm | 104.4% |
| Comparative Example 5 | 38% | 9.3 μm | 430 nm | 100.0% |
| Example 6 | 68% | 6.0 μm | 480 nm | 104.2% |
| Comparative Example 6 | 41% | 6.2 μm | 480 nm | 100.0% |
| Example 7 | 83% | 19.8 μm | 445 nm | 105.6% |
| Comparative Example 7 | 32% | 19.9 μm | 445 nm | 100.0% |

Example 8

Comparative Example 8

A gallium nitride (GaN)-based semiconductor having a peak wavelength of 460 nm was used as a light emitting element. A light converter was produced by using: a phosphor particle group, which was a particle group of green light emitting phosphor particles having a composition of $Eu_{0.01}Si_{11.80}Al_{0.20}O_{0.04}N_{15.96}$ (β-type SiAlON) (D50: 10.5 μm) and, 85% of which was composed of phosphors with the value obtained by dividing the longer particle diameter by the shorter particle diameter being greater than 1.0 and not greater than 3.0; and a divalent europium-activated nitride red light emitting phosphor having a composition of $(Ca_{0.99}Eu_{0.01})AlSiN_3$ (D50: 9.3 μm). The above-noted phosphor particle group was prepared by optimizing the temperature profile at a time of synthesis. Here, LA-920 (manufactured by HORIBA Ltd.) was used as a particle size distribution measuring equipment. The light converter was fabricated by dispersing the phosphor particle group and the red light emitting phosphors in a prescribed proportion in a sealing material made of thermosetting silicone resin as a medium and then sealing in a light emitting element. A light emitting apparatus of Example 8 was thus fabricated.

On the other hand, a light emitting apparatus of Comparative Example 8 was fabricated in the similar manner as Example 8, except that the phosphor particle group was a particle group of green light emitting phosphor particles having a composition of $Eu_{0.05}Si_{11.50}Al_{0.50}O_{0.05}N_{15.95}$ (β-type SiAlON) (D50: 7.6 μm) and that 40% of the phosphor particle group was composed of particles with the value obtained by the longer particle diameter by the shorter particle diameter being greater than 1.0 and not greater than 3.0.

For those Tight emitting apparatus of Example 8 and Comparative Example 8, the characteristic (brightness) was evaluated in the manner similar to Example 1. Tc-duv was also evaluated by turning on the light emitting apparatus under a condition of forward current (IF) of 20 mA and measuring white light from the light emitting apparatus by MCPD-2000 (manufactured by Otsuka electronics Co., Ltd.). The results are shown in Table 3. Table 3 shows that the light emitting apparatus of Example 8 is superior in characteristic (brightness) to the light emitting apparatus of Comparative Example 8.

TABLE 3

| | brightness (relative value) | Tc-duv |
|---|---|---|
| Example 8 | 103.9% | 7500 K + 0.001 |
| Comparative Example 8 | 100.0% | 7500 K + 0.001 |

The embodiment, examples and comparative examples disclosed here should be understood as being illustrative rather than being limitative in all respects. The scope of the present invention is shown not by the foregoing description but by the claims, and it is intended that the equivalency to the claims and all the modifications within the claims should be embraced here.

We claim:

1. A white light emitting apparatus comprising:
   a light emitting element of a gallium nitride-based semiconductor emitting primary light having a peak wavelength of 430-480 nm; and
   a light converter absorbing a part of said primary light to emit secondary light having a wavelength longer than a wavelength of said primary light,
   said light converter including a phosphor particle group of divalent europium-activated oxynitride green light emitting phosphor which is a β-type SiAlON substantially represented by a general formula:

$Eu_aSi_bAl_cO_dN_e$, where 0.005≤a≤0.2, b+c=12, d+e=16,
   said phosphor particle group of divalent europium-activated oxynitride green light consisting of a columnar particle in which a value obtained by dividing a longer particle diameter by a shorter particle diameter is greater than 1.0 and not greater than 3.0, and
   the light converter further comprising phosphor particles of a red light emitting phosphor.

2. The white light emitting apparatus of claim 1, wherein the red light emitting phosphor particles are particles of a divalent europium-activated nitride red light emitting phosphor expressed by a general formula $(MI_{1-f}Eu_f)MIISiN_3$, wherein MI is an alkaline-earth metal selected from the groups consisting of Mg, Ca, Sr and Ba; and MII is a trivalent metallic element selected from the group consisting of Al, Ga, In, Sc, Y, La, Gd and Lu; and 0.001≤f≤0.10.

3. The white light emitting apparatus of claim 1, wherein a median diameter of the phosphor particle group of divalent europium-activated oxynitride green light is in a range of 6-20 μm.

4. The white light emitting apparatus of claim 1, wherein a median diameter of the phosphor particle group of divalent europium-activated oxynitride green light is in a range of 6-20 μm.

5. A white light emitting apparatus comprising:
   a light emitting element of a gallium nitride-based semiconductor emitting primary light having a peak wavelength of 430-480 nm; and
   a light converter absorbing a part of said primary light to emit secondary light having a wavelength longer than a wavelength of said primary light,
   said light converter including a phosphor particle group of divalent europium-activated oxynitride green light emitting phosphor which is a β-type SiAlON substantially represented by a general formula:

$Eu_aSi_bAl_cO_dN_e$, where 0.005≤a≤0.2, b+c=12, d+e=16,
   wherein 60% or more of the phosphor particle group of divalent europium-activated oxynitride green light is composed of columnar phosphor particles in which a value obtained by dividing a longer particle diameter by a shorter particle diameter is greater than 1.0 and not greater than 3.0, and
   the light converter further comprising phosphor particles of a red light emitting phosphor.

6. The white light emitting apparatus of claim 5, wherein the red light emitting phosphor particles are particles of a divalent europium-activated nitride red light emitting phosphor expressed by a general formula $(MI_{1-f}Eu_f)MIISiN_3$, wherein MI is an alkaline-earth metal selected from the groups consisting of Mg, Ca, Sr and Ba; and MII is a trivalent metallic element selected from the group consisting of Al, Ga, In, Sc, Y, La, Gd and Lu; and 0.001≤f≤0.10.

7. The white light emitting apparatus of claim 6, wherein 80% or more of the phosphor particle group of divalent europium-activated oxynitride green light is composed of the phosphor particles in which a value obtained by dividing a longer particle diameter by a shorter particle diameter is greater than 1.0 and not greater than 3.0.

8. The white light emitting apparatus of claim 7, wherein a median diameter of the phosphor particle group of divalent europium-activated oxynitride green light is in a range of 6-20 μm.

9. The white light emitting apparatus of claim 6, wherein a median diameter of the phosphor particle group of divalent europium-activated oxynitride green light is in a range of 6-20 μm.

10. The white light emitting apparatus of claim 5, wherein 80% or more of the phosphor particle group of divalent europium-activated oxynitride green light is composed of the phosphor particles in which a value obtained by dividing a longer particle diameter by a shorter particle diameter is greater than 1.0 and not greater than 3.0.

11. The white light emitting apparatus of claim 10, wherein a median diameter of the phosphor particle group of divalent europium-activated oxynitride green light is in a range of 6-20 μm.

12. The white light emitting apparatus of claim 5, wherein a median diameter of the phosphor particle group of divalent europium-activated oxynitride green light is in a range of 6-20 μm.

* * * * *